United States Patent [19]

Lesk et al.

[11] Patent Number: 4,590,024
[45] Date of Patent: May 20, 1986

[54] SILICON DEPOSITION PROCESS

[75] Inventors: Israel A. Lesk, Phoenix; M. John Rice, Jr., Tempe; Kalluri R. Sarma, Mesa, all of Ariz.

[73] Assignee: Solavolt International, Houston, Tex.

[21] Appl. No.: 594,456

[22] Filed: Mar. 29, 1984

[51] Int. Cl.⁴ .............................................. B29C 13/00
[52] U.S. Cl. ....................................... 264/81; 118/719; 427/93
[58] Field of Search ........................................... 264/81

[56] References Cited

U.S. PATENT DOCUMENTS

| | | | |
|---|---|---|---|
| 3,950,479 | 4/1976 | Reuschel et al. | 264/81 |
| 4,035,460 | 7/1977 | Dietze et al. | 264/81 |
| 4,131,659 | 12/1978 | Authier et al. | 264/81 |
| 4,292,264 | 9/1981 | Cota et al. | 264/81 |
| 4,370,288 | 1/1983 | Rice et al. | 264/81 |

FOREIGN PATENT DOCUMENTS 56-048237  5/1981  Japan ..................................... 264/81

Primary Examiner—James Derrington
Attorney, Agent, or Firm—John A. Fisher

[57] ABSTRACT

An improved process is disclosed for the deposition in a reactor vessel of silicon on the interior walls of the reactor vessel and for the subsequent separation of the silicon from those walls. The reactor vessel has a generally rectangular cross section and is formed of a refractory material from which the deposited silicon separates by thermal expansion shear separation during cool down of the vessel and the deposited silicon. To improve the output of the deposition system, a plurality of partitions are provided in the reactor vessel and integral with the reactor walls. These partitions act as additional deposition surfaces, increasing the number of silicon sheets deposited as well as increasing the efficiency of the chemical reaction.

10 Claims, 6 Drawing Figures

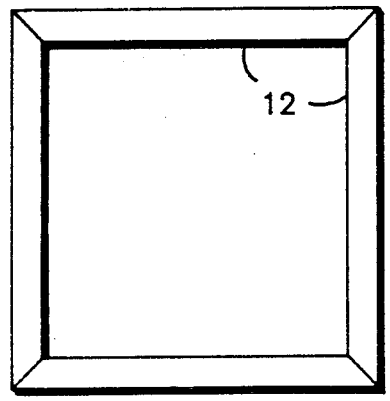
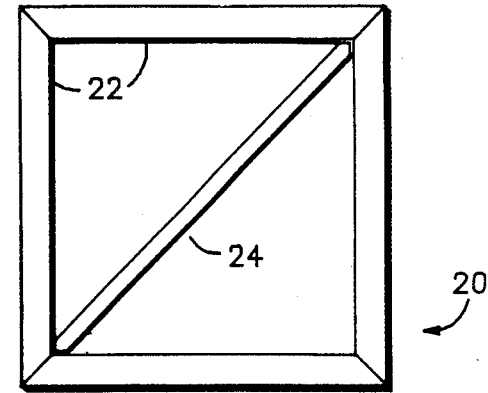
FIG. 1    FIG. 2
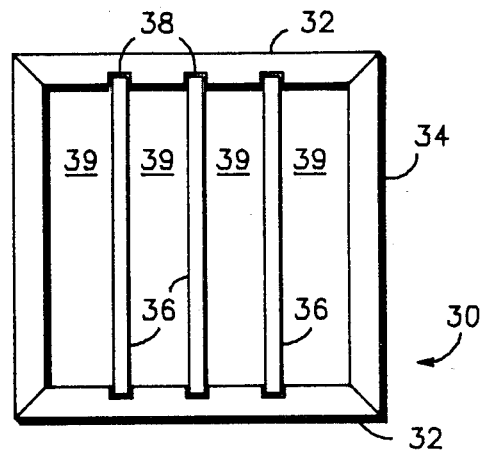
FIG. 3
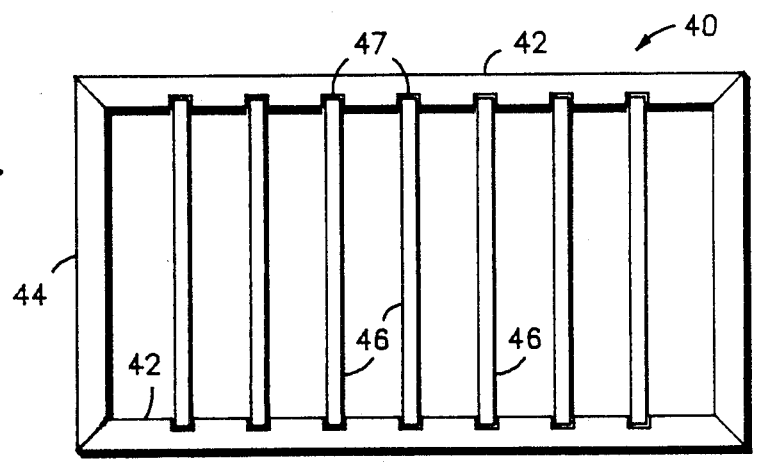
FIG. 4

SILICON DEPOSITION PROCESS

BACKGROUND OF THE INVENTION

This invention relates generally to an improved silicon deposition process and deposition substrate, and more specifically to an improved silicon deposition process utilizing partitioned deposition vessels.

To provide single crystal silicon for the semiconductor industry, it is typical to grow large single crystal ingots of silicon having the proper conductivity type and resistivity. The ingots are grown in a bell jar by depositing the silicon on one or more filaments heated by passing a current therethrough. The ingots are sawed into a plurality of thin circular wafers which are lapped and polished to the desired surface finish and thickness. The final wafers are of the high quality needed for many semiconductor devices such as integrated circuits, transistors, and the like. Producing wafers in this fashion, however, is very expensive. For many semiconductor devices the high quality wafer is necessary and the cost of the wafer is relatively insignificant compared to the high cost of the finished devices. In contrast, with some large area devices such as, for example, photovoltaic cells or solar cells, the cost of fabricating wafers in this fashion is prohibitive, especially when considering that wafers of this high quality are not absolutely necessary to the functioning of the solar cell device. Devices of this type, therefore, need a technique which is less expensive to produce the large quantities of required silicon.

One such technique for producing silicon of quality at least suitable for use in solar cells is the ribbon-to-ribbon (RTR) process. By this process, ribbons of polycrystalline silicon are converted directly to ribbons of macrocrystalline silicon without the need for first growing a single crystal ingot or for the sawing and lapping operations. In this context the term "macrocrystalline" refers to material having sufficiently large grains to permit significant phototovoltaic activity. In the RTR process a sheet of polycrystalline material is converted to macrocrystalline material by sweeping a molten zone across the polycrystalline material, causing the material to freeze out behind the molten zone with enhanced crystal size.

In order to make the RTR process successful, however, it is necessary to first produce sheets of polycrystalline material suitable for the conversion process. To this end, polycrystalline silicon has been deposited, for example by chemical vapor deposition or plasma deposition, onto a refractory substrate and then separated from the substrate by thermal expansion shear separation (TESS). These deposition processes, however, although more efficient than the aforementioned bell jar process, are of generally low chemical efficiency, with a large fraction of the available silicon in the silicon bearing reactant material not being utilized. A need therefore existed for an improved process for producing thin sheets of polycrystalline silicon in an efficient and economical manner.

It is therefore an object of this invention to provide an improved process for depositing polycrystalline silicon.

It is another object of this invention to provide an improved process for the simultaneous production of a plurality of silicon ribbons.

It is yet another object of this invention to provide an improved process for depositing silicon at enhanced chemical and energy efficiency.

It is still another object of this invention to provide an improved deposition substrate.

It is another object of this invention to provide an improved process for depositing silicon layers of uniform thickness.

BRIEF SUMMARY OF THE INVENTION

The foregoing and other objects and advantages of the invention are achieved through the use of a process utilizing a partitioned deposition reactor vessel. Silicon is deposited on and then separated from the interior walls and partitions of the vessel. The reactor vessel comprises a tube or box of refractory material having a substantially rectangular cross section. Integral with the interior walls of the reactor vessel are one or more substantially plane partitions which provide additional deposition surfaces.

BRIEF DESCRIPTION OF THE DRAWINGS

FIG. 1 illustrates a prior art deposition reactor vessel;

FIGS. 2-4 illustrate, in cross section, embodiments of a reactor vessel in accordance with the invention;

DETAILED DESCRIPTION OF PREFERRED EMBODIMENTS

Figures 5, 6:
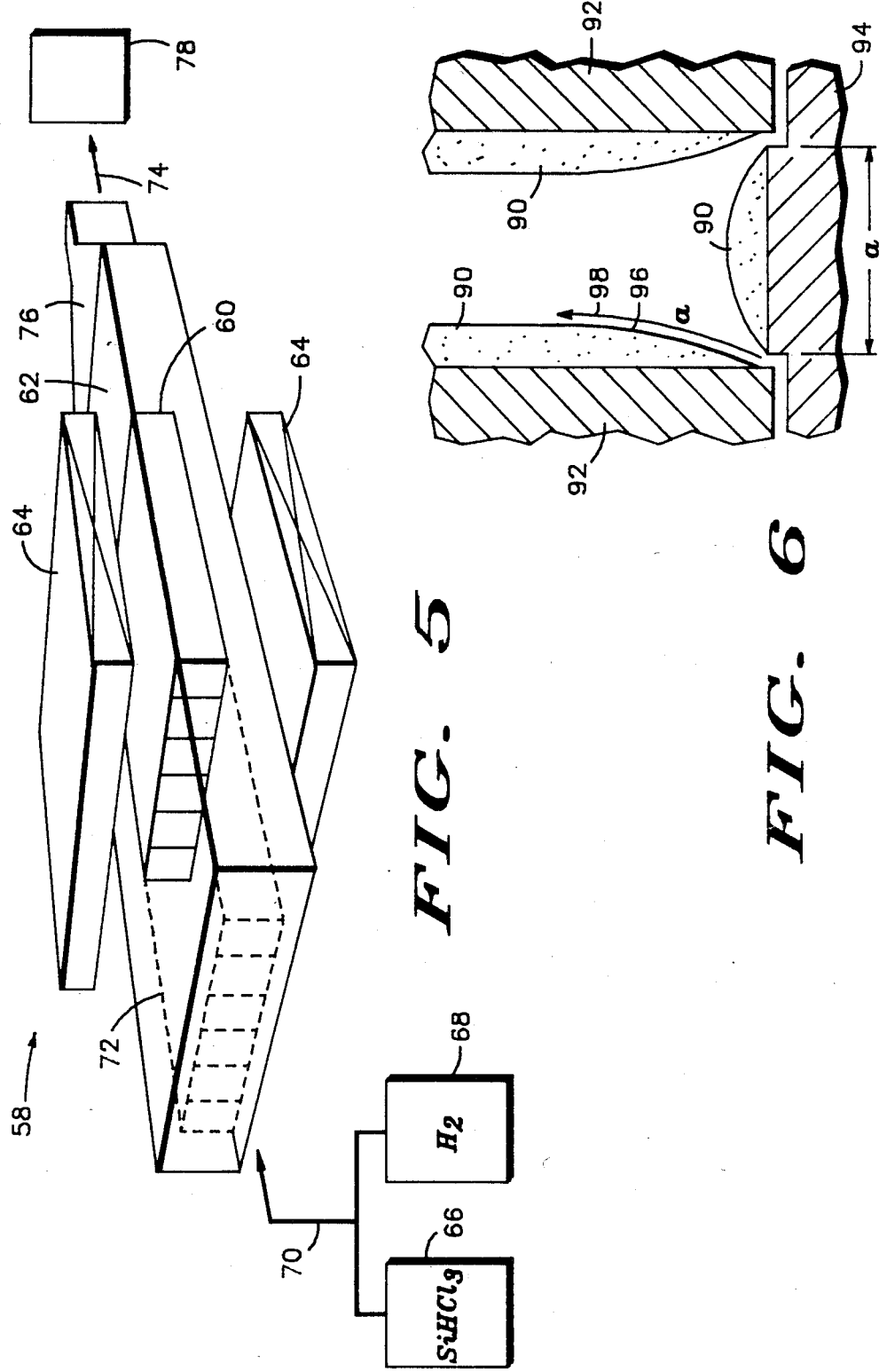
FIG. 5 illustrates schematically a deposition system for carrying out the process in accordance with the invention.
FIG. 6 illustrates, in a cross section through a portion of a deposition vessel, the silicon ribbon thickness transition region.

Various attempts have been made to deposit polycrystalline silicon in sheet or ribbon form onto a deposition substrate and then to separate the deposited silicon from the substrate to leave a free standing sheet of silicon. For example, in U.S. Pat. No. 4,292,264 silicon ribbon is deposited on deposition foils which move through a heated reaction zone. Upon exiting the reaction zone, the silicon and foil cool and the silicon is separated from the foil by thermal expansion shear separation (TESS). The separation results from the different thermal expansion characteristic of silicon and the deposition substrate. A preferred embodiment of the TESS process is disclosed in U.S. Pat. No. 4,370,288 wherein the preferred deposition substrate is disclosed to be a substrate of refractory material having an expansion coefficient different from the silicon and having a coating of a release layer such as finely divided graphite on the surface thereof.

One process for producing polycrystalline ribbons or sheets for the RTR process directs the flow of reactant gases through the interior of a reactor vessel wherein the interior walls of the reactor vessel provide deposition substrates upon which silicon is deposited from the reactant gases. Preferably, the reactor vessel has a substantially square cross section as shown in FIG. 1. The reactor vessel 10 is made of four rigid, demountable substrate walls 12. The walls are formed of a refractory material such as graphite or molybdenum and preferably are coated with a release layer of finely divided graphite. Each wall 12 has a length and width equal to the dimensions of the polycrystalline ribbon that is desired.

In the deposition process, as more fully explained below, the reactor vessel is contained within an enclosure such as a quartz tube for control of the reaction ambient. The reaction vessel is externally heated to a deposition temperature to cause the deposition of silicon on the interior walls as the reaction gases pass therethrough. One difficulty with using a deposition reactor vessel as illustrated in FIG. 1, however, is the inefficiency of utilization of reaction gases. In using trichlorosilane and hydrogen as the reaction gases, the maximum efficiency attainable at a deposition temperature of 1100°–1200° C. is about 32–34%. That is, 32–34% of the silicon available in the trichlorosilane can actually be deposited in the deposition reaction. This efficiency is reaction limited and represents an equilibrium condition at which the deposition of silicon is balanced by the simultaneous etching and removal of silicon by HCl formed as a reaction product. In carrying out the reaction in a deposition vessel as illustrated in FIG. 1 wherein the deposition substrates have a width of 9–10 cm and a length of about 15–30 cm, however, an efficiency of only about 19–20% is achieved, far below the theoretically achievable efficiency.

In accordance with the invention, the deposition efficiency is increased and the number of ribbons formed in each deposition process is increased by adding one or more internal partitions to the deposition reactor vessel. FIGS. 2–4 illustrate three embodiments of partitioned deposition reactor vessels in accordance with the invention. In each of these embodiments, the deposition reactor vessels are formed of rigid walls of refractory material such as molybdenum or graphite which preferably are coated with a release layer of finely divided graphite.

FIG. 2 illustrates a deposition reactor vessel 20 having a substantially square cross section formed by four rigid demountable walls 22. Integral with the walls is a removeable partition 24 positioned diagonally of the square cross section. The addition of the diagonal partition increases the number of deposition surfaces from 4 to 6. More importantly, the addition of the diagonal partition increases the deposition efficiency. For a square box having a side of about 9–10 cm and using trichlorosilane and hydrogen as input reactants, the deposition efficiency is increased from 19–20% without the partition to 22–24% with the partition.

FIG. 3 illustrates a second embodiment of a deposition reaction vessel 30 in accordance with the invention. Reactor vessel 30 includes rigid, demountable sidewalls 32, 34 forming a box of substantially rectangular cross section, and three removeable partitions 36 integral with sidewalls 32. The partitions can mount, for example, in slots 38 formed in sidewalls 32. Sidewalls and partitions are formed of a refractory material such as graphite or molybdenum and are preferably coated with a release layer of material such as finely divided graphite. Using deposition reactor vessel 30 and directing reactants such as trichlorosilane and hydrogen into the spaces 39 between walls and partitions, a deposition efficiency of 27–28% is achieved, compared to an efficiency of 19–20% for a similar reactor vessel without the partitions. In addition, the number of deposition surfaces is increased from 4 to 8 with only the portions of the interior surface of sidewall 32 located between partitions representing potentially unusable deposition surfaces.

FIG. 4 illustrates in cross section a partitioned deposition reactor vessel 40, in accordance with a further embodiment of the invention, including rigid demountable sidewalls 42, 44 forming a box of substantially rectangular cross section. Integral with the rigid sidewalls are seven partitions 46 which can, for example, fit into grooves 47 in sidewall 42. These sidewalls and partitions are formed of a refractory material, and preferably are coated with a release layer of material such as finely divided graphite. The use of seven partitions increases the number of deposition surfaces from 4 to 16 with only the interior surfaces of sides 42 representing potentially wasted deposition surface. In addition, in a deposition reactor 40 having walls about 9–10 cm on a side and using trichlorosilane and hydrogen as reactants, the deposition efficiency is increased to 32–34% or nearly the maximum achievable efficiency compared to 19–20% without the partitions.

While the inventors do not wish to be bound by any particular theory, it is believed that the increased efficiency results from the closer proximity of the heated deposition surfaces. The positioning of the deposition surfaces reduces the distance through which reactants must diffuse to effect the deposition. The chemical efficiency appears to increase as the spacing between partitions decreases. The minimum spacing, or the maximum number of partitions to be added to a deposition box of given dimensions, is limited by the ability to uniformly heat the partitions to the deposition temperature from an external heat source and by the requirement for uniform reactant gas flow between the partitions.

The heat for the reaction is supplied to the reactants by the partitions, and an increased number of partitions requires an increase in heat supplied. Overall energy efficiency is improved, however, because a shorter furnace hot zone is required to deposit a given amount of silicon. Additionally, the radiant heat loss from a deposition enclosure is the same whether the box contains partitions or not. A partitioned deposition vessel, in accordance with the invention, thus is capable of providing deposition substrates for an increased number of silicon ribbons without an increase in radiant heat loss. This is in contrast to a prior art bell jar deposition system wherein increases in the number of deposition filaments (which are individually heated, not externally heated) is accompanied by a like increase in the amount of radiated energy loss.

FIG. 5 schematically illustrates apparatus 58 for carrying out the silicon deposition process in accordance with the invention. Apparatus 58 includes a partitioned deposition reactor vessel 60 in which the silicon deposition takes place. While this embodiment illustrates only a single deposition reaction vessel, in other embodiments the apparatus may include, for example, a plurality of such partitioned reaction vessels which move, one after another, through the deposition apparatus. The partitioned vessel is enclosed within a furnace tube 62 which can be, for example, a quartz furnace tube within which the ambient is controlled. Preferably quartz tube 62 is sized to closely fit the exterior dimension of vessel 60. The close fit impedes the flow of reactants between the tube and vessel and minimizes the deposition of silicon on the outside of the vessel. Suitable means, not shown, seal the input end of tube 62. Heating means 64 such as resistance heating coils, radiant heating lamps, or the like raise the temperature in the reaction vessel to the deposition temperature. Depositions are typically carried out in the temperature range of 1000°–1200° C., and preferably in the temperature range of about 1050°–1150° C. Reactants 66, 68 such as trichlorosilane and hydrogen are conveyed to the deposition apparatus through tubing 70. Trichlorosilane and hydrogen are the preferred reactants, but other silicon source reactants such as silicon tetrachloride, dichlorosilane, silane, or other silicon halides can also be used. A gas distribution plenum 72 establishes the correct gas flow and distributes reactants uniformly to the spaces between the partitions, and between the end partitions and the interior sidewalls of the deposition vessel 60. The plenum is located in the unheated portion of tube 62 so that the gases are distributed without depositing on the walls of the plenum. In one embodiment of the invention, the plenum is a second, unheated deposition reaction vessel 72 in end-to-end alignment with vessel 60. Unreacted gases and reaction products exit the deposition apparatus at 74 through an end cap 76. The effluent from the reaction is collected at 78 for subsequent separation, reuse, and the like.

In initial work leading to the invention, doubts existed as to whether the partition members could be raised to the same deposition temperature as the wall members of the deposition vessel. With multi-surface partitioned boxes, the reactant gas flow can be large, and there was concern that heat flow from the outside of the box, where it is absorbed from source 64, would not be sufficient to heat the interior partitions so that all internal surface areas were at the same temperature. It was found that sufficiently uniform temperatures existed to give uniform deposits of silicon on the interior walls and on the partitions.

A further advantage of depositing silicon on a partitioned deposition vessel, in accordance with the invention, is the improved uniformity of the deposited ribbon. Because of corner effects, deposition is not uniform at the ribbon edges; the deposit is thin at the corner and gradually thickens as a function of distance from the corner. FIG. 6 illustrates, in a cross section through a portion of a deposition vessel, deposits of silicon 90 on partitions 92 and deposition vessel wall 94. For a spacing "a" between partitions, the transition region 96 in which the thickness of the deposit is changing will also have a length of the order "a" as indicated by arrow 98. The closer spacing of partitions 92 thus results in ribbons of more uniform thickness having a shorter transition region.

As a more specific example, polycrystalline ribbons of silicon were grown in a deposition reactor vessel without partitions and in a deposition reactor vessel having 7 vertical partitions fitted into slots formed in the vessel walls. Each vessel had an interior dimension of about 9.1 cm but the partitioned vessel was shorter in length. The reactor walls and partitions were of graphite coated with DAG137 supplied by the Acheson Colloids Company. The reactor vessels were positioned in a square, fused silica tube in a resistance heated furnace heated to 1100° C. The silicon deposition was carried out for 75 minutes in the unpartitioned vessel and for 90 minutes in the partitioned vessel with 55 liters per minute of hydrogen and 31 grams per minute of trichlorosilane. The silicon was doped P-type by the addition of $B_2H_6$ to the reactant gases. Upon cooling the vessels, four silicon ribbons were obtained from the unpartitioned vessel; the ribbons had a thickness varying from 100 to 200 micrometers. Sixteen silicon ribbons were obtained from the partitioned vessel; the ribbons had a thickness varying from 125 to 150 micrometers. The total amount of silicon deposited on the partitioned vessel was consistent with a deposition efficiency of more than 30%, compared to about 19% on the unpartitioned vessel.

Thus, it is apparent that there has been provided, in accordance with the invention, an improved process for the deposition of silicon and a reaction vessel for use in such process that meets the objects and advantages set forth above. While the invention has been described with respect to preferred embodiments thereof, it is not intended that the invention be limited to these illustrative embodiments. Further modifications and variations will occur to those skilled in the art after review of the foregoing detailed description. It is therefore intended that all such variations and modifications which fall within the spirit and scope of this invention be covered by the appended claims.

We claim:

1. A process for the fabrication of silicon sheets which comprises the steps of: providing a deposition reactor vessel having walls, said walls having interior surfaces bounding a reaction volume; providing a plurality of partitions within said reaction volume integral with and demountable from said interior surfaces; introducing silicon bearing reactants to said reaction volume; heating said reaction volume to deposit silicon from said silicon bearing reactants onto said interior surfaces and said partitions; and separating said deposited silicon in the form of sheets from said interior surfaces and said partitions.

2. The improved process of claim 1 wherein said walls and said partitions comprise refractory material having thereon a layer of finely divided graphite.

3. The improved process of claim 2 wherein said refractory material comprises graphite.

4. The improved process of claim 1 wherein said reactor vessel comprises a graphite tube of substantially rectangular cross section.

5. The improved process of claim 4 wherein said graphite tube is positioned in a quartz tube.

6. The improved process of claim 5 wherein a gas plenum is provided in said quartz tube to direct reactants to spaces in said reactor vessel between adjacent ones of said partitions.

7. The improved process of claim 4 wherein said plurality of partitions comprises 3 or more partitions.

8. A process for the chemical vapor deposition of silicon which comprises the steps of: providing a reaction vessel having interior wall surfaces; providing additional substantially plane surfaces of refractory material interior to and integral with said reaction vessel; introducing silicon bearing reactants to said reaction vessel; heating said reactants to chemical vapor deposit silicon on said interior wall surfaces and said additional substantially plane surfaces; and separating said silicon in the form of sheets from said interior wall surfaces and said substantially plane surfaces.

9. The improved process of claim 1 wherein said reaction vessel comprises a refractory tube of substantially rectangular cross section and said additional surfaces comprise the two major surfaces of a substantially plane partition positioned along a diagonal of said substantially rectangular cross section.

10. The improved process of claim 1 wherein said reaction vessel comprises a refractory tube of substantially rectangular cross section and said additional surfaces comprise a plurality of plane partitions positioned substantially parallel to an edge of said rectangular cross section.

* * * * *